(12) United States Patent
Nishikawa et al.

(10) Patent No.: US 8,763,928 B2
(45) Date of Patent: Jul. 1, 2014

(54) LIQUID MATERIAL VAPORIZER

(75) Inventors: Ichiro Nishikawa, Kyoto (JP); Takeshi Kawano, Uji (JP)

(73) Assignee: HORIBA STEC, Co., Ltd., Kyoto-shi (JP)

( * ) Notice: Subject to any disclaimer, the term of this patent is extended or adjusted under 35 U.S.C. 154(b) by 0 days.

(21) Appl. No.: 12/444,348

(22) PCT Filed: Oct. 5, 2007

(86) PCT No.: PCT/JP2007/069610
§ 371 (c)(1),
(2), (4) Date: Apr. 3, 2009

(87) PCT Pub. No.: WO2008/041769
PCT Pub. Date: Apr. 10, 2008

(65) Prior Publication Data
US 2010/0044461 A1 Feb. 25, 2010

(30) Foreign Application Priority Data
Oct. 5, 2006 (JP) ................................. 2006-274518

(51) Int. Cl.
*B05B 1/24* (2006.01)
*B01B 1/00* (2006.01)
*B01B 1/06* (2006.01)
*C23C 16/448* (2006.01)

(52) U.S. Cl.
CPC ............ *C23C 16/4486* (2013.01); *B01B 1/005* (2013.01); *B01B 1/06* (2013.01)
USPC .......................................... 239/136; 239/135

(58) Field of Classification Search
CPC ..................................... B05B 1/24; B05B 7/16

USPC .................................. 239/128, 133–136, 139
See application file for complete search history.

(56) References Cited

U.S. PATENT DOCUMENTS

| | | | | |
|---|---|---|---|---|
| 3,096,817 A | * | 7/1963 | McKenna | 165/60 |
| 3,971,913 A | * | 7/1976 | Myklebust | 392/337 |
| 4,028,445 A | * | 6/1977 | Hickmann et al. | 261/142 |
| 4,132,883 A | * | 1/1979 | Grime | 392/337 |
| 4,267,976 A | * | 5/1981 | Chatwin | 239/102.2 |

(Continued)

FOREIGN PATENT DOCUMENTS

| | | |
|---|---|---|
| JP | 05-15766 | 1/1993 |
| JP | 06291040 A | 10/1994 |

(Continued)

*Primary Examiner* — Davis Hwu
(74) *Attorney, Agent, or Firm* — Alleman Hall McCoy Russell & Tuttle LLP

(57) ABSTRACT

This invention provides a vaporizer that prevents deterioration of a precursor while reducing a residue, that can expect reduction in risk of clogging, and that can increase vaporization flow easily. The vaporizer comprises an inlet port for introducing a precursor in a liquid phase or a gas-liquid mixture phase, a vaporizing section for vaporizing the precursor arranged on the downstream side of the inlet port, and an outlet port for delivering the precursor vaporized at the vaporizing section, wherein the vaporizing section is of a flow channel type comprising a nozzle for spraying the precursor and a heating channel arranged on the downstream side of the nozzle continuously thereto. A plurality of vaporizing sections are arranged in parallel between the inlet port and the outlet port, and arranged such that each vaporizing section can distribute the precursor independently of each other.

4 Claims, 11 Drawing Sheets

(56) References Cited

U.S. PATENT DOCUMENTS 5,372,754 A * 12/1994 Ono .............................. 261/142
7,452,424 B2 * 11/2008 Okabe et al. .................. 118/726
2006/0065254 A1    3/2006 Okabe et al.

FOREIGN PATENT DOCUMENTS

| JP | 2003-163168 | 6/2003 |
| JP | 2006-100737 | 4/2006 |
| KR | 1020060051785 A | 5/2006 |

* cited by examiner

LIQUID MATERIAL VAPORIZER

FIELD OF THE ART

This invention relates to a vaporizer for vaporizing various kinds of a liquid precursor used for, for example, a semiconductor manufacturing process.

BACKGROUND ART

Conventionally, this kind of vaporizer has an arrangement wherein a gas-liquid mixture comprising a liquid precursor and a carrier gas used for forming a film is discharged from a nozzle so as to be depressurized, and then heat is applied by a heating channel arranged on a downstream side of the nozzle so as to vaporize the liquid precursor (patent document 1).

However, some liquid material, that is often used as a precursor for high-k process, of a recent semiconductor element has a property of being easy to be thermally decomposed and has low vapor pressure. As a result, the following problem is generated more than ever before.

More specifically, the liquid precursor has to be at a high temperature in order to be vaporized because it has a low vapor pressure. However, since the liquid precursor is easy to be thermally decomposed, if exposed to high temperature in order to vaporize, a part of the precursor is deteriorated so as to be a residue. As a result, the nozzle might be clogged or a particle might be produced.

Furthermore, since a conventional vaporizer is of a single nozzle structure, if a nozzle is clogged, there would be a problem in that it becomes impossible to continue vaporization, and operation is halted almost completely. Especially in a semiconductor manufacturing process, it is not preferable to halt the operation.

In considering this problem, if a plurality of nozzles are simply arranged, the mist sprayed from each of the nozzles overlap with each other to be mixed at some position so as to generate a difference in the concentration of the mist. Thus, there is no other choice but for the mist to be vaporized at a temperature adjusted for the highest concentration. As a result, thermal decomposition of the precursor is likely to be caused.

A slightly improved version of the vaporizer is shown in FIG. 14. The arrangement in FIG. 14 contains a description of a structure wherein a plurality of heating channels are arranged to correspond to a plurality of nozzles, however, the heating channel and the nozzle are discontinuous and a space is formed therebetween. Thus the same problem as that mentioned above will be generated, more or less, because there will be a difference in the concentration of the spray due to a difference in a degree of overlap of the spray.

Patent document 1: Japan patent laid-open number 2003-163168

DISCLOSURE OF THE INVENTION

Problems to be Solved by the Invention

The present claimed invention intends to solve all of the problems and a main object of this invention is to provide a vaporizer that prevents deterioration of a precursor while reducing a residue, reducing risk of clogging, and easily increasing vaporization flow.

Means to Solve the Problems

More specifically, the vaporizer in accordance with this invention comprises an inlet port for introducing a precursor in a liquid phase or a gas-liquid mixture phase, a vaporizing section for vaporizing the precursor arranged on the downstream side of the inlet port, and an outlet port for delivering the precursor vaporized by the vaporizing section, and is characterized in that the vaporizing section is of a flow channel type comprising a nozzle for spraying the precursor and a heating channel arranged on the downstream side of the nozzle continuously thereto, and a plurality of vaporizing sections are arranged in parallel between the inlet port and the outlet port, and each vaporizing section is arranged so the precursor flow through vaporization sections are independent of each other.

In accordance with this arrangement, the precursor flow through the plurality of vaporizing sections flow independently of each other, without interference. As a result, the mist sprayed from each nozzle flows alone in each corresponding heating channel, and the mist sprayed from different nozzles will not be mixed, so the concentration of the mist will be generally uniform. In addition, since the concentration of the mist to be vaporized is uniform, it is possible to more effectively vaporize the mist, at a low temperature with a reduced thermal dose, compared with using a conventional arrangement wherein the mist is vaporized at a temperature adjusted for the highest concentration.

The improvement of effective vaporization of this invention can also be explained from another point of view. More specifically, in the case of comparing this vaporizer having a plurality of heating channels with a conventional vaporizer having one heating channel, if a total cross sectional area of the nozzle(s) is equal (the same flow) for both vaporizers, it is possible for the vaporizer having a plurality of heating channels to conduct vaporization effectively at a low temperature since a vaporized amount per nozzle can be made smaller than that of the conventional vaporizer, and the heat can be effectively conducted because a contact area of the fluid flowing inside of the heating channels is large. In addition, it is possible for this invention to make each of the multiple heating channels thin so that a difference of a temperature distribution becomes small. Also in terms of this, it is possible for the vaporizer of this invention to conduct vaporization effectively at a low temperature, whereas the heating channel of the conventional vaporizer is large in diameter and so it is difficult for the heat to be conducted to a center part thereof, and it is necessary to adjust the setting temperature to be high in order to be tailored to the vaporization at the center part of the heating channel.

As a result of this, in accordance with this invention, it is possible to prevent a residue due to thermal decomposition of the precursor and to prevent clogging of the nozzle. Conversely, if the temperature is set to be the same as that of the conventional vaporizer, it is possible for the vaporizer of this invention to flow much more of the precursor than the conventional vaporizer, namely a large amount of precursor flow can be flown.

Furthermore, even if one nozzle is clogged, precursor can flow from another nozzle, so it is possible to reduce a risk that the operation is completely halted.

In order to simplify a heating structure or a flow channel structure of the vaporizing section and to make it possible to apply the heat effectively, it is preferable to provide a single first block body (hereinafter referred to as a common block body) where each of the vaporizing sections is formed, and to promote vaporization in each of the vaporizing sections by applying the heat to the first block body.

In order to make it possible to form a flow channel to divide the precursor from the inlet port to each vaporizing section more easily, it is preferable to further provide a second block body (hereinafter also referred to as a dividing flow block body) where a dividing flow channel for dividing the precursor from the inlet port to each of the vaporizing sections is formed, and to arrange the second block body on the upstream side of the first block body.

Effect of the Invention

In accordance with this invention, vaporization can be conducted at a lower temperature compared with a conventional vaporizer so that it is possible to prevent a residue due to thermal decomposition of the precursor and to prevent clogging of the nozzle. Conversely, if the temperature is set at the same as that of the conventional vaporizer, it is possible for the vaporizer of this invention to flow much more of the precursor, namely a large amount of precursor flow can be flown.

Furthermore, even if one nozzle is clogged, the precursor can flow from another nozzle so that it is possible to reduce a risk that the operation is completely halted.

BEST MODES OF EMBODYING THE INVENTION

Figure 1:
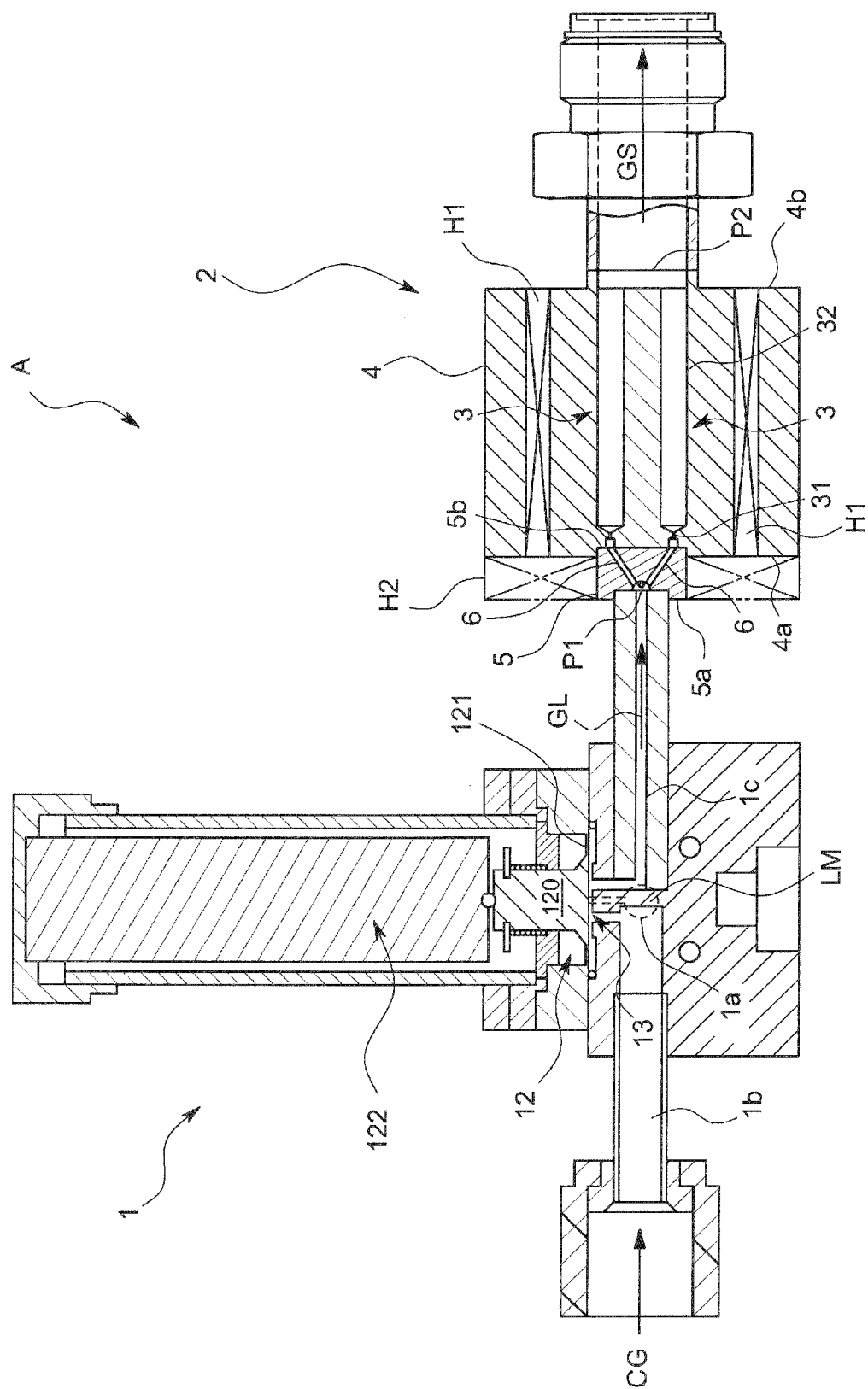
FIG. 1 is a longitudinal sectional pattern diagram showing a structure of a vaporizer in accordance with one embodiment of the present claimed invention.
Figure 2:
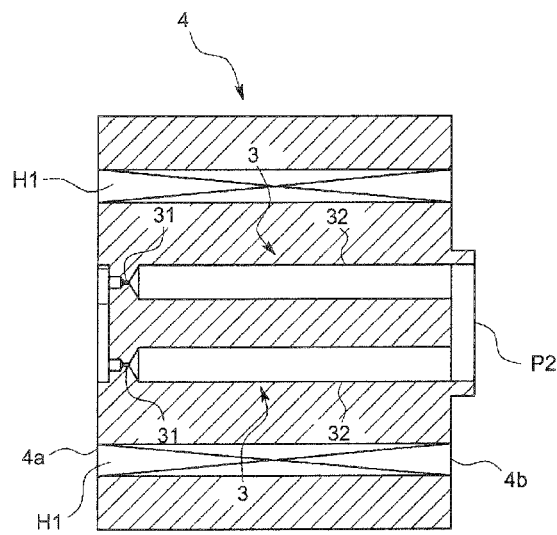
FIG. 2 is a center longitudinal sectional view of a first block body in accordance with this embodiment.
Figure 3:
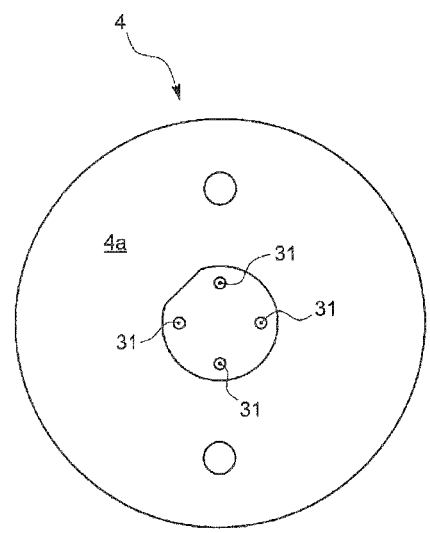
FIG. 3 is an end view of the first block body in accordance with this embodiment.
Figure 4:
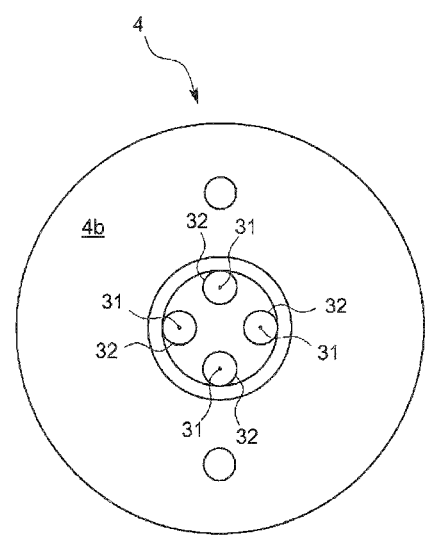
FIG. 4 is the other end view of the first block body in accordance with this embodiment.
Figure 5:
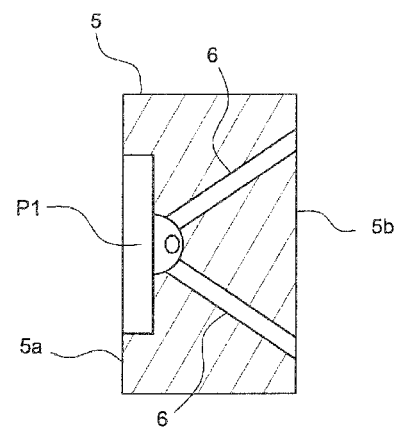
FIG. 5 is a center longitudinal sectional view of a second block body in accordance with this embodiment.
Figure 6:
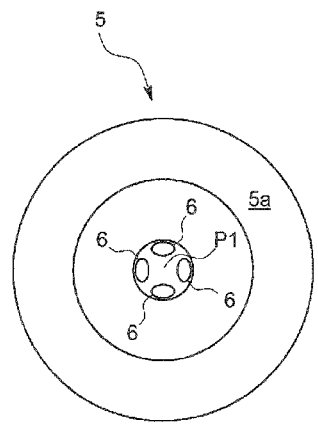
FIG. 6 is an end view of the second block body in accordance with this embodiment.
Figure 7:
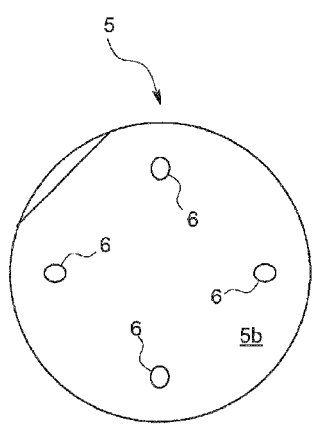
FIG. 7 is the other end view of the second block body in accordance with this embodiment.
Figure 8:
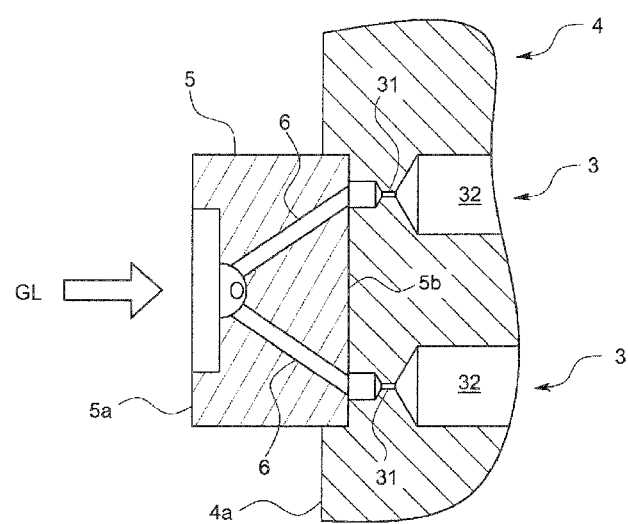
FIG. 8 is a detailed view of a principal part in FIG. 1.

One embodiment of the present claimed invention will be explained with reference to the drawings.

A vaporizer A in accordance with this embodiment constitutes a part of, for example, a semiconductor manufacturing system (not shown in the drawings) and has a function of providing a precursor for forming a semiconductor element in a gaseous phase by being connected to a vacuum chamber (not shown in the drawings).

Concretely, the vaporizer A comprises, as shown in FIG. 1, a vapor liquid mixing mechanism 1 that mixes the precursor (also refer to as a liquid precursor) LM in a liquid phase with a carrier gas CG so as to produce a gas-liquid mixture GL, and a vaporizing body mechanism 2 that vaporizes the liquid precursor LM contained in the gas-liquid mixture GL so as to make it in a state of a gas phase (also referred to as a precursory gas) and then to discharge the precursory gas GS outside, namely into a vacuum chamber together with the carrier gas CG.

First, the vapor liquid mixing mechanism 1 will be explained briefly. The vapor liquid mixing mechanism 1 comprises a gas-liquid mixing chamber 13, by which a liquid precursor introducing channel 1a and a carrier gas introducing channel 1b communicate. Then, as mentioned above, the liquid precursor LM and the carrier gas CG are mixed in this gas-liquid mixing chamber 13. Thus, a produced gas-liquid mixture GL is delivered through a delivering channel 1c that is in communication with the gas liquid mixing chamber 13. The carrier gas CG alone may be introduced on a constant basis or at a predetermined period and a residue generating in the delivering channel 1c and/or a vaporizing section, including a nozzle 31, may be purged.

The vapor liquid mixing mechanism 1 further comprises a flow control section 12, and has a function of maintaining a flow of the liquid precursor LM at a previously determined constant flow amount. The flow control section 12 drives a valve body 120 supported by, for example, a diaphragm 121 with a piezoelectric actuator 122 and controls an opening degree of a valve arranged at the liquid precursor introducing channel 1a or the like so as to control the flow.

Meanwhile, the vaporizing body mechanism 2 comprises an inlet port P1 for introducing the gas-liquid mixture GL, a vaporizing section 3 arranged on the downstream side of the inlet port P1 for vaporizing the liquid precursor LM contained in the gas-liquid mixture GL, and an outlet port P2 for delivering the precursory gas GS vaporized by the vaporizing section 3.

In this embodiment, as shown in FIG. 2-FIG. 4, and FIG. 8, a plurality (e.g., four, in this embodiment) of vaporizing sections 3 are arranged in parallel between the inlet port P1 and the outlet port P2, and each of the vaporizing sections 3 is arranged so the precursor flow through vaporizing sections are independent of each other, without interference.

Each of the vaporizing sections 3 is of a flow channel type having an identical shape, comprising a nozzle 31 for spraying the liquid precursor LM contained in the gas-liquid mixture GL and a heating channel 32 arranged on the downstream side of the nozzle 31 continuously thereto. "Arranged continuously" means that the nozzle and the heating channel are continuously covered by a continuous inner circumferential surface, and it means that all of the liquid precursor LM sprayed by the nozzle 31 is introduced into a corresponding heating channel 32 without mixing into other heating channels 32. In this embodiment, each of the vaporizing sections 3 is formed in a single first block body (common block body) 4.

The first block body 4 is, for example, in a shape of a cylinder made of metal that is superior in both resistance to corrosion and thermal conductivity, and the four vaporizing sections 3 are arranged in parallel to a center axis of the first block body 4 so as to penetrate the first block body 4 from an end surface 4a to the other end surface 4b.

The nozzle 31 is formed by narrowing down a diameter of the flow channel of the vaporizing section 3. In addition, a bore or a plurality of bores is arranged in parallel to the vaporizing section 3, and a cartridge heater H1 of a lengthy shape to fit into the bore is inserted into the first block body 4 almost from one end to the other end (refer to FIG. 1). With this arrangement, the flow channel arranged on the downstream side of the nozzle 31 functions as the heating channel 32 to apply heat to the fluid passing the flow channel. Merits of this arrangement include that it is easy to process, easy to downsize in a radial direction, possible to apply heat sufficiently because the cartridge heater H1 generally has a large heat release value, and possible to conduct heat efficiently because the cartridge heater H1 is buried in the common block body 4. In addition, for example, a tubular heater may be fittingly inserted over a side peripheral surface of the first block body 4, or a plate shaped heater may wrap a side peripheral surface of the first block body 4.

Furthermore, in this embodiment, as shown in FIG. 5-FIG. 7 and FIG. 8, a second block body (a dividing block body) 5 for dividing the flow to each of the vaporizing sections 3 is mounted on the upstream side of the first block body 4, namely, one end surface 4a of the first block body 4.

The second block body 5 is in a cylindrical shape having a smaller diameter than that of the first block body 4, and the inlet port P1 to be connected with the delivering channel 1c is formed at a center part of one end surface 5a. Then a plurality (four in this embodiment) of linear dividing channels 6 penetrate from the inlet port P1 toward the other end surface 5b of the second block body 5 slightly at an angle. The other end opening of each dividing channel 6 is set at a position corresponding to an end opening of each vaporizing section 3, and the other end surface 5b of the second block body 5 is mounted on the end surface 4a of the first block body 4 with each of the axes aligned so that each dividing channel 6 is in communication with each vaporizing section 3 respectively.

It is required that the first block body 4 and the second block body 5 be made of a material that is superior in heat resistance and resistance to corrosion because of a property of the fluid flowing inside the first block body 4 and the second block body 5.

In addition, the second block body 5 is so arranged to project from the end surface 4a of the first block body 4 by being mounted on the first block body 4, and a block for preheating H2 is further mounted on a side peripheral surface of the projecting portion of the second block body 5. The block for preheating H2 is in a shape of a ring made of, for example, aluminum, and arranged to receive heat from the first block body 4 so as to preheat the gas-liquid mixture GL passing the block for preheating H2.

The reason to arrange the second block body 5 separately from the first block body 4 is mainly because of the merit that it is easy to construct the dividing channel 6 from the inlet port P1 to each vaporizing section 3. The dividing block body 5 and the first block body 4 may be made of the same material or the different material.

In accordance with this arrangement, since the mist sprayed from each nozzle 31 flows alone in each corresponding heating channel, the mist sprayed from different nozzle 31 will not be mixed, so the concentration of the mist will be generally uniform. In addition, since the concentration of the mist to be vaporized is uniform, it is possible to vaporize the mist more effectively, at a low temperature with a reduced thermal dose, compared to using a conventional arrangement wherein the mist is vaporized at a temperature adjusted for the highest concentration.

In addition, when comparing vaporizer A having a plurality of heating channels 3 with a conventional vaporizer having one heating channel, if a cross sectional area of a nozzle for the conventional vaporizer and a total cross sectional area of a plurality of nozzles for this vaporizer A are the same (the same flow), a vaporized amount per nozzle, of the vaporizer A having a plurality of heating channels 3, becomes smaller than that of the conventional vaporizer. Also in terms of this, vaporization can be conducted effectively at a low temperature. As other factors, it is conceivable that it is possible for multiple heating channels to conduct heat effectively because a contact area of the fluid flowing inside of the heating channels is large, and it is possible for multiple heating channels to lower the temperature setting because a difference of a temperature distribution in the heating channel is small since each of the heating channels can be made thin, whereas the heating channel of the conventional vaporizer is large in diameter so it is difficult for the heat to be conducted to a center part thereof and it is necessary to adjust the temperature setting to be high in order to be tailored for the vaporization at the center part of the heating channel.

More specifically, vaporization can be conducted at a lower temperature compared with a conventional vaporizer, so it is possible to prevent a residue due to thermal decomposition of the precursor and to prevent clogging of the nozzle 3. Conversely, if the temperature is set to be the same as that of the conventional vaporizer, it is possible for the vaporizer A to flow much more precursor than the conventional vaporizer, namely a large amount of precursor flow can be flown.

Furthermore, even if one nozzle 3 is clogged, the precursor can flow from the other nozzle 3, so it is possible to reduce a risk that the operation is completely halted.

Next, more concrete effects of the vaporizer A in accordance with this embodiment will be explained with reference to a result of an experiment conducted in comparison with a conventional vaporizer having a single nozzle and a single heating channel.

Figure 9:
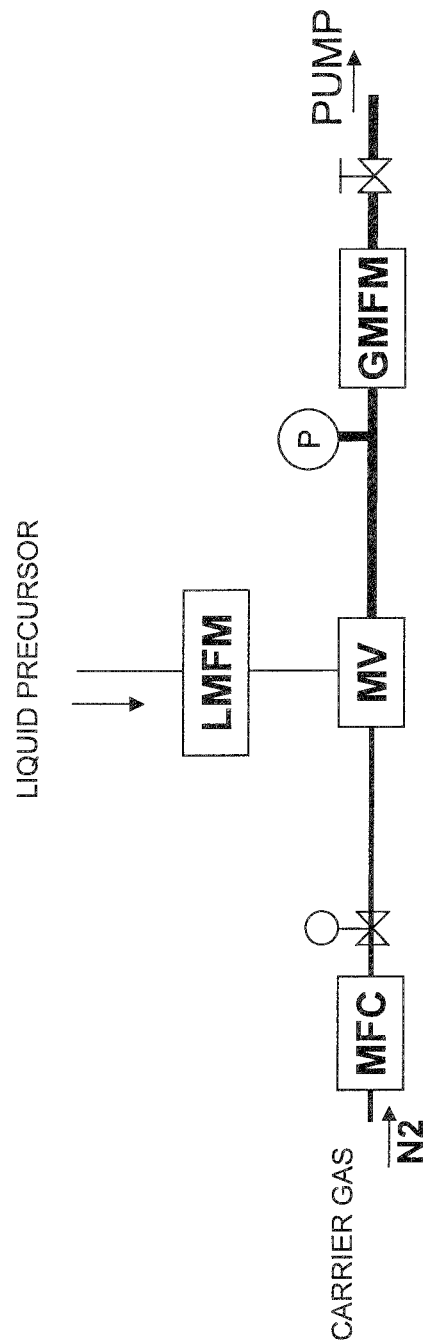
FIG. 9 is a pattern diagram of a performance experiment system of the vaporizer in accordance with this embodiment.

In this experiment, a system shown in FIG. 9 was used. The reference code MV denotes a vaporizer and the vaporizer of this embodiment or a conventional vaporizer is arranged here. The reference code P denotes a pressure sensor, MFC denotes a mass flow controller, LMFM denotes a liquid flow meter and GMFM denotes a gas flow meter.

The liquid precursor for an experiment having the same vapor pressure as that of a precursor for forming a semiconductor element is introduced into the liquid precursor introducing channel 1a of the vaporizer, and nitrogen gas is introduced into the carrier gas introducing channel 1b.

All the elements in this experiment are as follows.
Precursor flow: 0.25, 0.5, 0.75, 1.0, 1.25 [g/min]
Carrier gas: 1 [SLM]
Temperature of flow controller of the vaporizer: 60[° C.]
Temperature of vaporizing section of the vaporizer: 120 or 140[° C.]
Pipe temperature on the downstream side (secondary side) of the vaporizer: 140[° C.]
Back pressure: 5 [Torr]

A cycle of flowing the precursor for 1 min in a state of continuous flow of the carrier gas, and then ceasing flowing the precursor for about 30 sec was repeated under the above-mentioned elements, and then the gas flow was measured over time by the use of the gas flow meter GMFM arranged on the downstream side of the vaporizer. The flow of the precursor was 0.25 [g/min] for the first cycle, and increased by 0.25 [g/min] for every cycle and the cycle was repeated until the precursor flow reached 1.25 [g/min]. The results of the flow measurement are shown in FIG. 10-FIG. 12.

Since a certain amount of the liquid precursor flow is introduced periodically, if the liquid precursor is vaporized completely, the gas flow on the downstream side of the vaporizer is supposed to be stabilized so that its measurement waveform is a rectangular waveform with a flat upper side. However, if the liquid precursor is not vaporized completely, the gas flow fluctuates by an amount of the liquid precursor that is not vaporized so that the measurement waveform of the gas flow becomes unstable with a jagged upper side.

Figure 10:
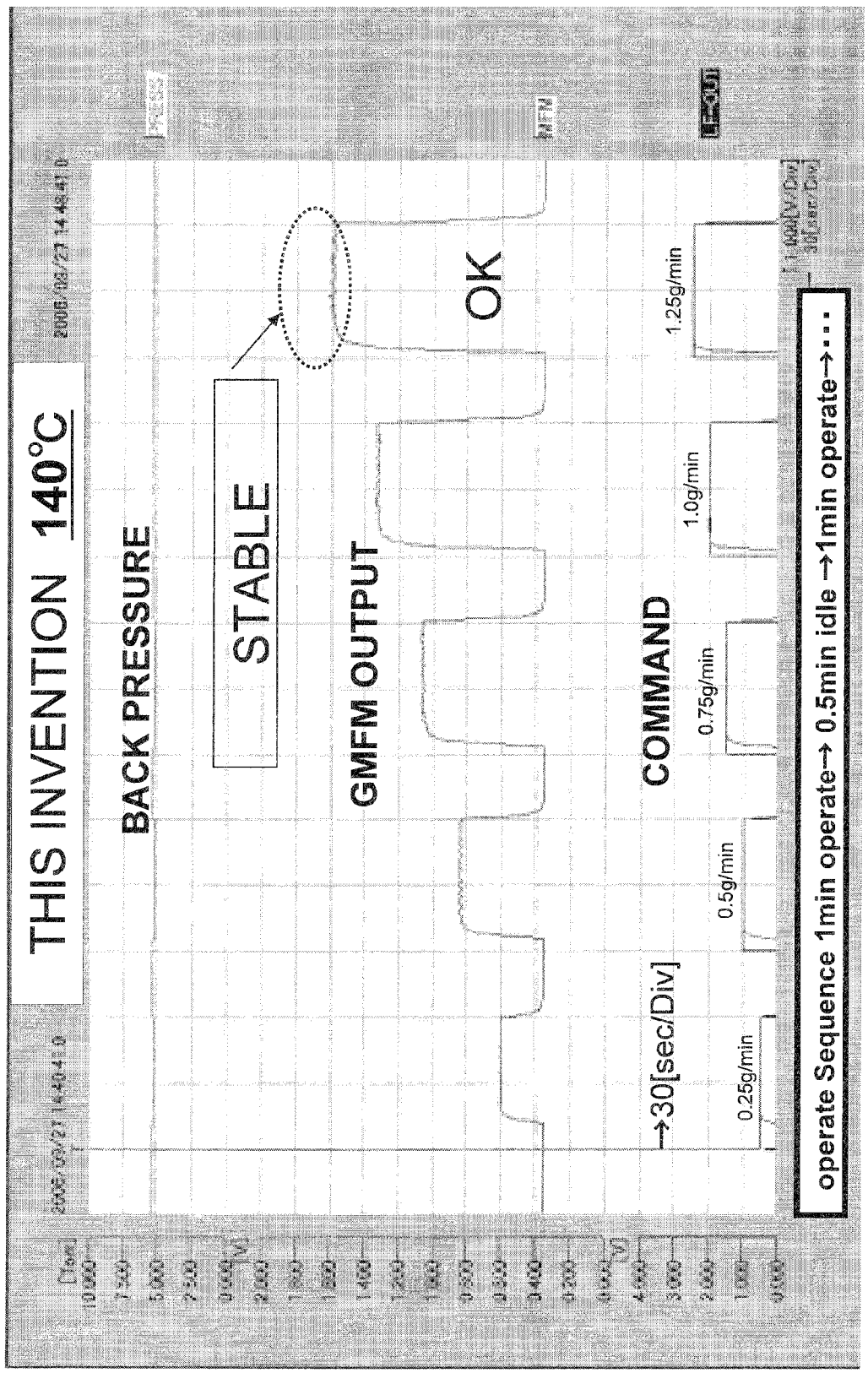
FIG. 10 is an experimental result showing a performance of the vaporizer in accordance with this embodiment by the use of the performance experiment system shown in FIG. 9.
Figure 12:
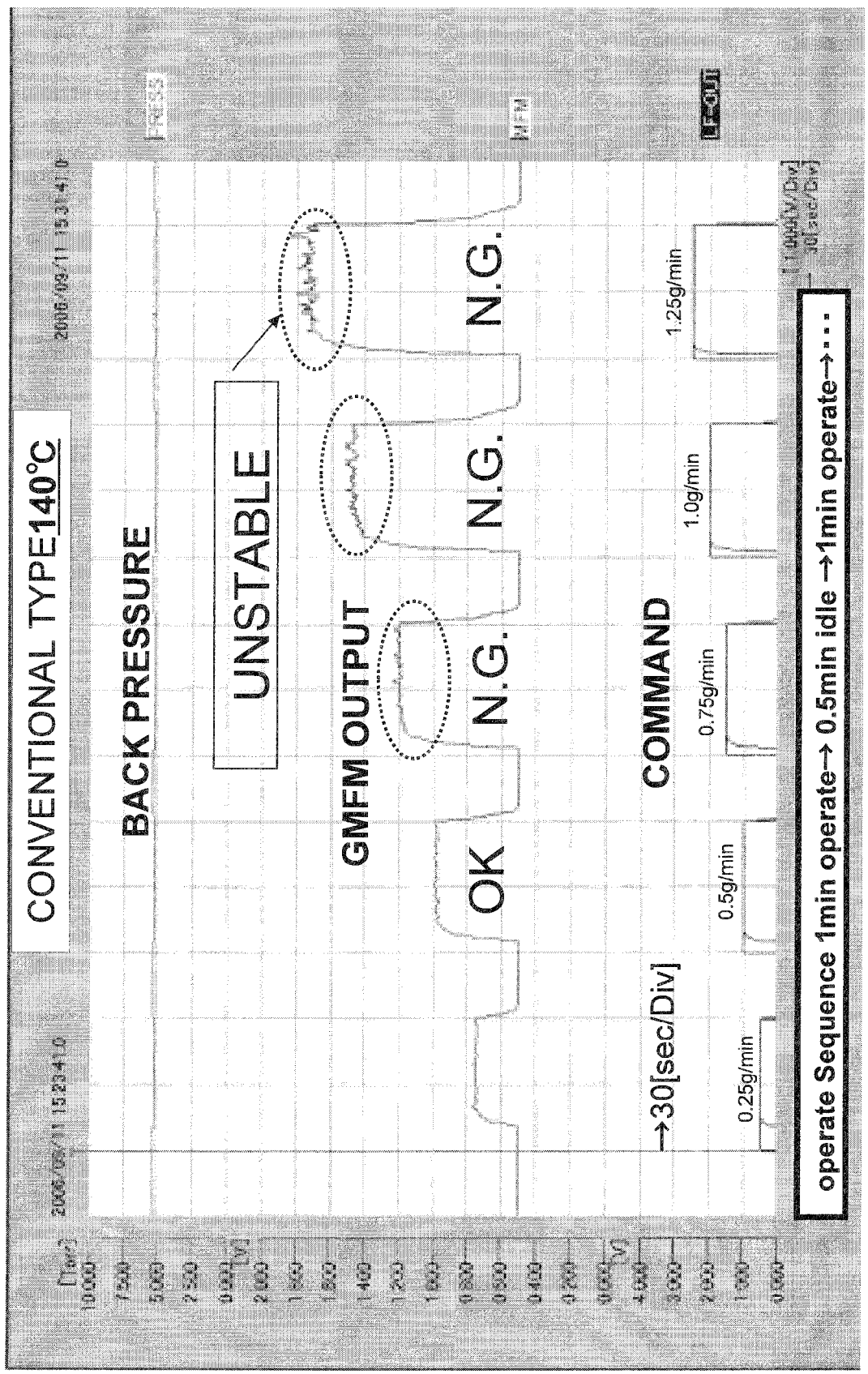
FIG. 12 is an experimental result in the case that the vaporizer of the performance experiment system shown in FIG. 9 is replaced by a conventional vaporizer having a single valve and a single flow channel.

Then FIG. 10 and FIG. 12 are compared. FIG. 10 shows an experimental result conducted on the vaporizer of this embodiment when the vaporizing section was set at 140° C., and FIG. 12 shows an experimental result conducted on the conventional vaporizer when the vaporizing section was set at 140° C. As is clear from FIG. 10, with the vaporizer of this embodiment, turbulence was hardly shown in the measurement waveform even though the flow was increased up to 1.25 [g/min]. On the contrary, as shown in FIG. 12, with the conventional vaporizer the measurement waveform was stable until the flow was 0.5 [g/min] and turbulence was shown after the flow exceeded 0.5 [g/min], which proved that vaporization is not appropriately conducted. More specifically, the vaporizer of this embodiment produces an effect that an amount of the flow is larger than that of the conventional vaporizer under the same temperature.

Figure 11:
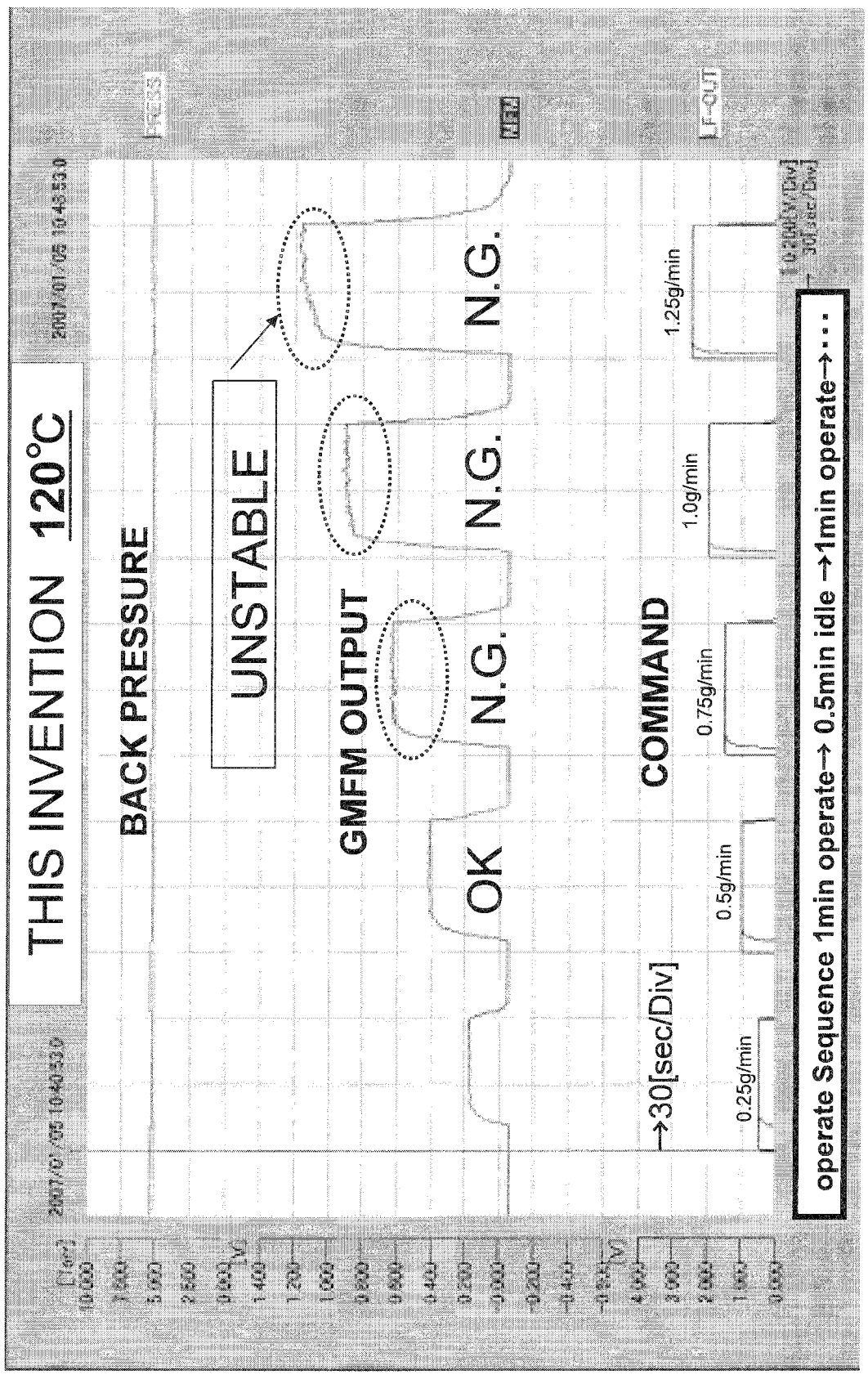
FIG. 11 is an experimental result showing a performance of the vaporizer in accordance with this embodiment by the use of the performance experiment system shown in FIG. 9.

In addition, FIG. 11 is an experimental result conducted on the vaporizer of this embodiment when a temperature of the vaporizing section was lowered to 120° C. According to this result, the measurement waveform was stable until the flow was 0.5 [g/min], similar to the conventional vaporizer. More specifically, if the flow is the same, it is possible for the vaporizer of this embodiment to lower the temperature compared with the conventional vaporizer.

Figure 13:
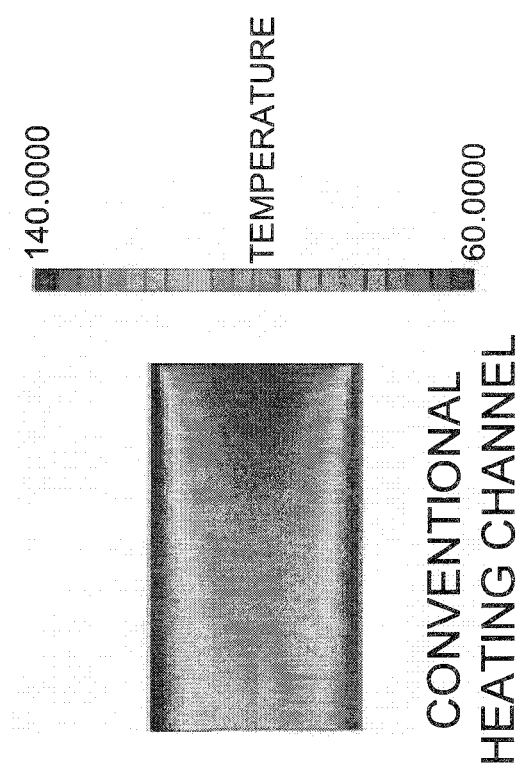
FIG. 13 is a simulation result of a comparison of a temperature distribution of an inside of the heating channel between a conventional vaporizer having a single valve and a single flow channel and the vaporizer in accordance with this embodiment.
Figure 13:
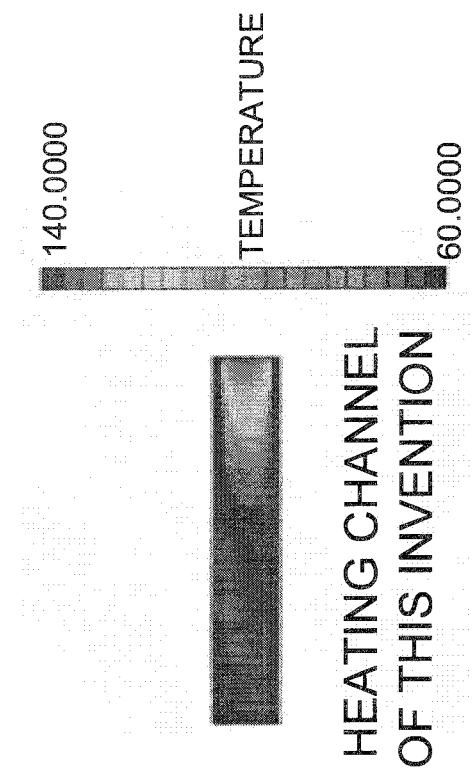
Figure 14:
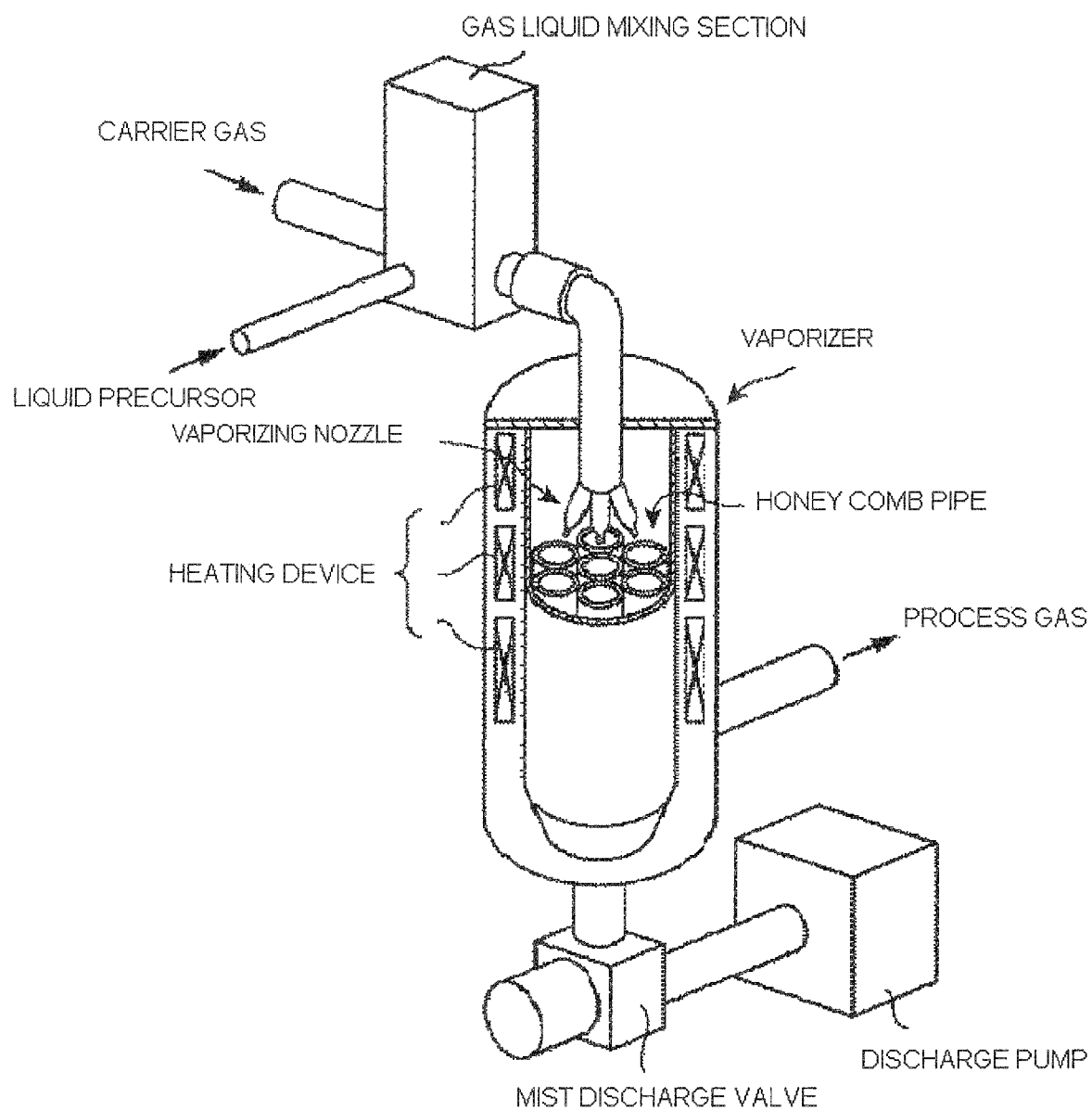
FIG. 14 is a general view showing an example of another conventional vaporizer.

Furthermore, FIG. 13 shows a simulation of temperature distribution of the inside of the vaporizing section. While a low temperature area of the vaporizing section of the conventional vaporizer extends downstream, a low temperature area of the vaporizing section of this embodiment lies only partially upstream and the other area is kept at a high temperature.

This invention is not limited to the above-mentioned embodiment. For example, a number of vaporizing sections is not limited to four, and may be any number, such as two or nine, as long as the design of the vaporizer permits. A concrete example of a nozzle diameter may be, if the same vaporizing amount as that of a conventional single nozzle is expected, about 0.7 times as much as that of a single nozzle in the case of two nozzles, about 0.5 times as much as that of a single nozzle in the case of four nozzles, and about 0.33 times as much as that of a single nozzle in the case of nine nozzles.

A cross-sectional area (diameter) of the heating channel contributes to a vaporizing effect. In the case that a total cross-sectional area of multiple heating channels in accordance with this invention is made to be smaller than a cross-sectional area of a conventional single heating channel, if the flow is the same, the flow rate becomes fast for the heating channel of this invention whose cross-sectional area is smaller. If the flow rate becomes fast, there is a demerit in that the heat quantity given by the heater decreases. However, it is possible to improve the vaporizing efficiency because the spray from the nozzle is smaller, and the pressure reducing effect becomes dominant if the flow rate is increased, as long as an effect of reducing the heat quantity given by the heater is outstanding and within a certain limit.

In addition, it is preferable that the heating sections are formed rotationally-symmetric on a concentric circle in a cross-sectional view so as to make a distance from a heater to each vaporizing section equal, in the case that the heater is arranged to surround a circumference of the first block body. Multiple heaters may be arranged to correspond to each vaporizing section so that a distance from a heater to the corresponding vaporizing section becomes equal (e.g., if there are four vaporizing sections, there are four heaters). Thus, heating to each vaporizing section becomes equal as much as possible so that it is possible to prevent heating unevenness and to conduct vaporization effectively at a low temperature.

The first block body is not necessarily in a cylindrical shape, and may be in various shapes such as a cuboid or a rectangular column. The same applies to the second block body. In addition, the first block body and the second block body may be integrated.

Furthermore, these block bodies are not necessarily required, and each of the vaporizing sections may be arranged in a pipe separately from each other. In this case, it is required to heat each pipe respectively.

In addition, if a filling material is filled in the heating channel, heat is easily conducted even though the pressure is low, so the liquid precursor can be, more preferably, further vaporized. The filling material is preferably made of titanium. This is because titanium is superior in thermal conductance. In addition, a shape of the filling material is represented by, for example, a ball, and a static mixer is more preferable. With this arrangement, since it is not only easy to conduct the heat under low pressure but also pressure loss becomes small, it is possible to, more preferably, further vaporize the liquid precursor.

Furthermore, if a filter is mounted on the downstream side of the nozzle, for example, near an exit of a heating channel, it is possible to remove the liquid precursor that fails to be vaporized among the gas-liquid mixture.

In addition, it is a matter of course that this vaporizer can be applied to not only a semiconductor manufacturing process that treats a high-k material comprising a low vapor pressure material, but also for a general use such as vaporizing a liquid precursor in addition to the semiconductor manufacturing process.

In addition, a concrete arrangement of each section is not limited to the above-mentioned embodiment, and may be variously modified without departing from the spirit of the invention.

POSSIBLE APPLICATIONS IN INDUSTRY

In accordance with this invention, it is possible to provide a vaporizer that prevents deterioration of a precursor while reducing a residue, reducing risk of clogging, and easily increasing vaporization flow so that the precursor can be vaporized even with a reduced heating temperature.

The invention claimed is:

1. A vaporizer comprising:
an inlet port for introducing a precursor in a liquid phase or a gas-liquid mixture phase;
a plurality of vaporizing sections arranged on a downstream side of the inlet port for vaporizing the precursor; and
an outlet port for delivering the precursor vaporized by the vaporizing sections, the plurality of vaporizing sections arranged in parallel between the inlet port and the outlet port,
wherein each of the vaporizing sections is of a flow channel type comprising a nozzle unshared by any other vaporizing section, for spraying the precursor, and a corresponding heating channel coupled to a downstream side of the nozzle, and
wherein a wall surface that forms the nozzle is continuously connected to a wall surface that forms the corresponding heating channel, so that precursor flow through each of the respective vaporizing sections is independent of the precursor flow through any other vaporizing section.

2. The vaporizer described in claim 1, comprising a single first block body where each of the vaporizing sections is formed, wherein vaporization is promoted in each of the vaporizing sections by applying heat to the first block body.

3. The vaporizer described in claim 2, further comprising a second block body where a dividing channel for dividing the precursor from the inlet port to each of the vaporizing sections is formed, wherein the second block body is arranged on an upstream side of the first block body.

4. The vaporizer described in claim 1 wherein each of the vaporizing sections encloses an independent flow of the precursor.

* * * * *